United States Patent [19]

Lungo

[11] 4,317,093
[45] Feb. 23, 1982

[54] ELECTRIC FILTER AND METHOD OF MANUFACTURE

[76] Inventor: Antonio Lungo, 11941 Abbey Rd., North Royalton, Ohio 44133

[21] Appl. No.: 16,566

[22] Filed: Mar. 1, 1979

[51] Int. Cl.³ .................. H03H 9/58; H03H 9/05; H03H 9/50; H03H 9/15
[52] U.S. Cl. .................. 333/187; 310/328; 310/348; 310/355; 333/189
[58] Field of Search .............. 333/187, 189, 186, 199, 333/188, 192, 200; 310/345–346, 348–356, 321–325, 328–334

[56] References Cited

U.S. PATENT DOCUMENTS

| | | | |
|---|---|---|---|
| 2,227,904 | 1/1941 | Hight | 310/355 |
| 2,877,432 | 3/1959 | Mattiat | 333/199 |
| 3,370,188 | 2/1968 | Blomster | 310/352 |
| 3,518,470 | 6/1970 | Lungo | 310/352 |
| 3,612,922 | 10/1971 | Furnival | 333/187 X |
| 3,918,013 | 11/1975 | Lungo | 333/187 |

FOREIGN PATENT DOCUMENTS

| | | | |
|---|---|---|---|
| 937419 | 1/1956 | Fed. Rep. of Germany . | |
| 878375 | 9/1961 | United Kingdom | 333/189 |

Primary Examiner—Marvin L. Nussbaum
Attorney, Agent, or Firm—Watts, Hoffmann, Fisher & Heinke Co.

[57] ABSTRACT

In an electric filter device such as a band pass filter, a resonator having hollow tubes soldered to both outside faces is suspended in a casing by springs which engage the ends of the tubes. In multiple resonator assemblies the end resonators have hollow tubes projecting from the outside faces for attachment to the springs, and the inside faces are joined by telescoping force fit hollow tubes. In one embodiment, the resonators are of different shapes.

37 Claims, 8 Drawing Figures

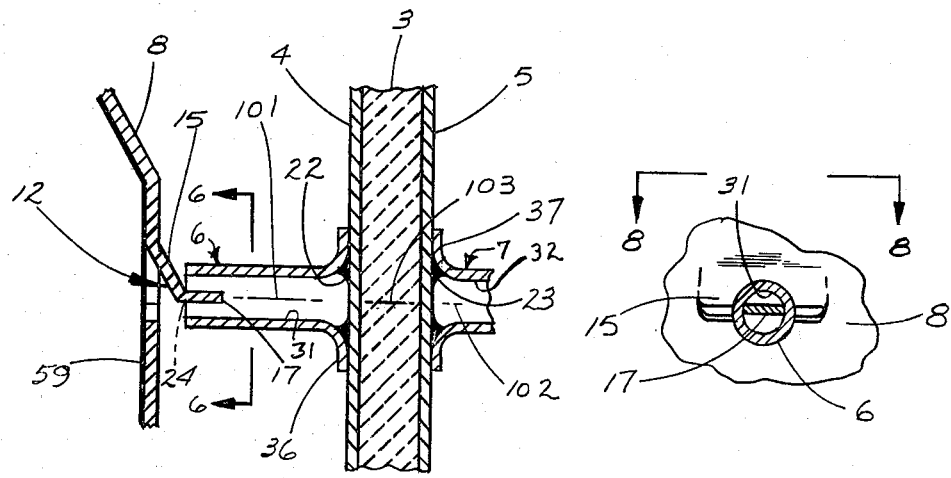
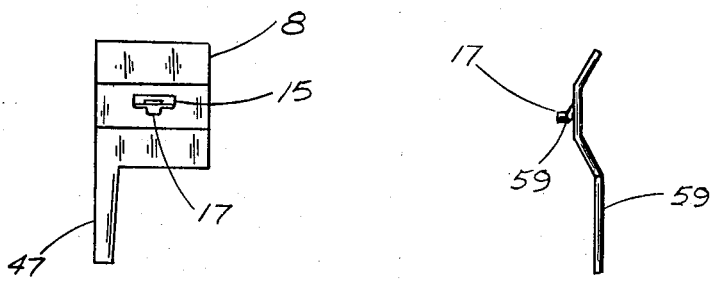
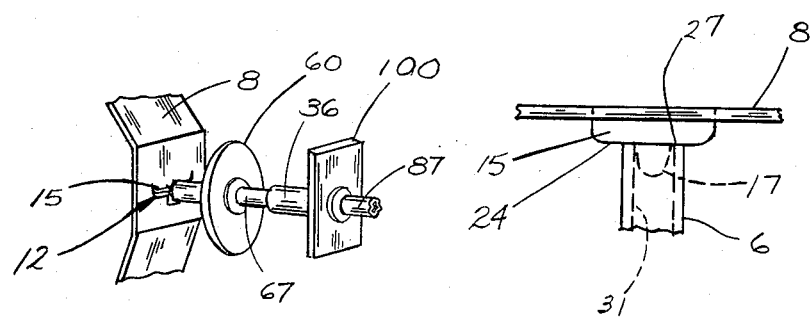

ELECTRIC FILTER AND METHOD OF MANUFACTURE

BACKGROUND OF THE INVENTION

The present invention relates to electrical filters, and more particularly to such filters made from piezoelectric materials.

In one form of filter, a disc-like ceramic piezo-electric resonator, having opposed metallic surfaces thereon, is suspended inside a casing. The suspension is often by wires or springs which also provide the current leads to and from the resonator.

In one form of prior device, the lead wires were soldered to the metallic outer surfaces of the resonator. Such approach had the disadvantage that the device needed to be tuned after the soldering operation was completed. Such tuning not only required an extra step, but the step was often difficult, because it required that a precise amount of ceramic material be uniformly removed from the circumference of the resonator. Moreover, the soldering of the wires established a type of mechanical connection which added spurious resonances which interfered with the operation of the resonator.

Another form of prior device used a spring type of mounting for the resonator. In such mounting electrically conductive springs directly contacted the generally planar faces of the resonator. Such approach was developed to eliminate the difficulties resulting from soldering wires to the metallic surfaces of the electrode. However, the pressure contact required precise control of the internal dimension of the case or housing to hold the movement of the resonator, as a result of shock or vibration, to a tolerable minimum. In view of the practical requirements of an unrestrained circumference, and the dimensional variations of the case and resonator, a small amount of movement occurred at the point of contact and support. Such movement resulted in a small shift in resonant frequency and a variation in mechanical Q, which are undesirable effects. Such movement also caused a wearing of the silver electrodes, which sometimes led to intermittant operation.

Moreover, special problems existed when two or more resonators were mechanically coupled together to form multiple resonator designs, such as, for example a two resonator three-terminal design. Such multiple resonators were costly, difficult to fabricate and assemble and generally provided poor control of filter center frequency and band width.

One form of prior multiple resonator device used a coupling rod passing through the machined out center of adjacent discs, and another machined a monolithic structure, of resonators and integral connecting rods, from a one-piece solid structure. In neither device was there a projection from the outside face of the end resonators. Such structures provided end resonators loaded mechanically on one face only (the internal faces). The effect was to increase the number of spurious resonances, as well as to place restrictions on the maximum diameter of the coupling rod. As a result, if the coupling rod was reduced in diameter to reduce spurious resonances, the device was not as strong as desired and subject to damage from vibration and shock.

As an attempt to eliminate the problems of the coupling rod type of device, solid extensions were fabricated on one face of individual resonators at the node of vibration. The solid extensions were then coupled to each other by a conducting epoxy which fastened the extensions together as described in U.S. Pat. No. 3,051,919. However, with extensions or stems on only one side of each resonator, a structure resulted having the aforesaid problems. In addition, such coupling resulted in poor filter performance under certain conditions of time and temperature, as the elastic properties of the epoxy changed with time and temperature. The device was also fragile.

SUMMARY OF THE INVENTION

In accordance with certain aspects of the present invention, hollow tubular projections are fixably soldered on both sides of the opposed external metallized surfaces of a single ceramic resonator filter. Springs, mounted in the housing contact the tubes at locations spaced from the planes of the resonator's metallized faces.

In a preferred embodiment, leaf springs have blade like extensions which press against the ends of the tubes. The blade like extensions have positioning tabs which project inside the tubes.

In multiple resonator devices, hollow tubular projections are fixably soldered to the outside faces of the end resonators of multiple resonator devices and attached to springs in the same manner as described in connection with the single resonator devices.

In a preferred multiple resonator embodiment, a hollow connection is made between the confronting faces of adjacent resonators. In one embodiment the hollow connection is made by a telescopic force fit between separate hollow tubes projecting from confronting faces of adjacent resonators. A ground wire is disposed within the force fit.

In one embodiment of a multiple resonator the adjacent resonators are of different geometrical shapes.

In addition, novel methods are providing for constructing and assembling some of the embodiments hereunder.

The removal of the spring contact away from the faces of the resonator as accomplished as one aspect of the present invention eliminates the wear of the thin silver electrode coating due to jarring, thereby eliminating the intermittant loss of contact resulting therefrom, which occurred in the prior art spring devices. At the same time, the locking of the spring to the tubular projections, provided by the invention eliminates the shifts in resonant frequency, and the variations in mechanical Q, also associated with such prior art spring devices. In addition, the tube and spring arrangement of the invention also eliminates for single resonator filters the spurious resonances associated with the soldered wire type of prior structure, and significantly reduces such resonances in the multiple resonator devices. The resonator is securely locked in place, yet the tube extensions, when dimensioned to represent a compliance, do not add to spurious resonances. The single resonator structure can have a spurious free response from below the main resonances of the assembly to the overtone resonances, and such spurious resonances are greatly reduced in the multiple resonator device. In addition, the tubing extension arrangement provides the desirable feature of suppression of the overtone resonances.

Also, by the present invention solder can be applied to the inside of the tube extension, thereby restricting solder flow. Such restriction and control provides a more uniform and symmetrical mechanical loading to the resonator so as to decrease mechanical load, and frequency variations.

In addition, the tube extensions provide a support for carrying the resonator from one production operation to another, without damage such as chipping. Such chipping of the ceramic is undesirable, as it contributes to frequency variations and introduces spurious resonances.

The use of the tube extensions also is particularly beneficial for automation of production. The tube extensions provide more feasible support for the resonator in the final assembly operation. Even the speed of manual assembly is increased.

The means of connecting adjacent resonators in a multiple resonator device has many advantages over the prior art devices. For example, an advantage of the multiple resonator structure of the hollow tube construction of the present invention is that the diameter of the tube coupling member is larger than for solid rod-type couplers in filters having the same band width. For example, in a 455 Khz filter, the tube diameter ranges from 0.040 to 0.060 inches. The rod diameter is no more than 0.025 inches. Thus, the larger diameter permitted by the present invention provides an assembly which is stronger and more resistant to damage from vibration and shock.

Another important feature of the multiple resonator in accordance with the present invention is that the resonator can be tuned individually before being mechanically coupled. The center frequency of the assembled filter coincides very closely to the tuned frequency of the individual resonators. By contrast, earlier coupling techniques required a tuning operation after assembly. One such operation is described in U.S. Pat. No. 3,051,919. Tuning after assembly is much more difficult, considering the influence and interaction that each resonator has on the other.

Another advantage of the multiple resonator of the present invention is that the coupling member is stable with time and temperature.

Still another advantage of the present invention is the provision of a filter which is smaller in overall size as compared to filters of comparable quality of other constructions. This is an advantage where space is important, as in automobile radios.

The use of different shapes of resonators in multiple resonator devices provides further suppression of unwanted frequencies.

It can be seen from the foregoing description that a variety of advantages flow from the structure of the present invention and that additional advantages exist where a multiple resonator construction is involved. By the arrangement of the present invention a less expensive, easier to construct, and improved reliability filter device having several excellent performance characteristics is provided.

BRIEF DESCRIPTION OF THE DRAWINGS

FIG. 3 is a fragmentary enlargement of a portion of FIG. 1;

FIG. 4 is a front end elevation of a spring for use in connection with the present invention prior to mounting the spring inside the casing;

FIG. 5 is a side elevation view of the spring of FIG. 4;

FIG. 6 is a sectional view taken along the lines 6—6 in FIG. 3;

FIG. 7 is a fragmentary perspective view of adjacent resonators of different shapes.

FIG. 8 is a fragmentary top plan view illustrating the positioning of the spring extension against the resonator tube projection.

DESCRIPTION OF THE PREFERRED EMBODIMENTS

Figure 1:
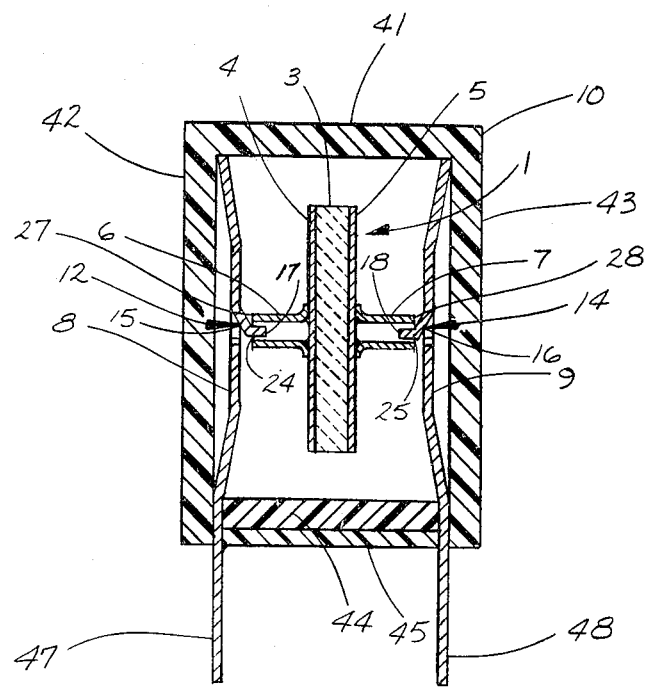
FIG. 1 is a cross sectional elevation view of a single resonator filter device in accordance with aspects of the present invention.
Figure 2:
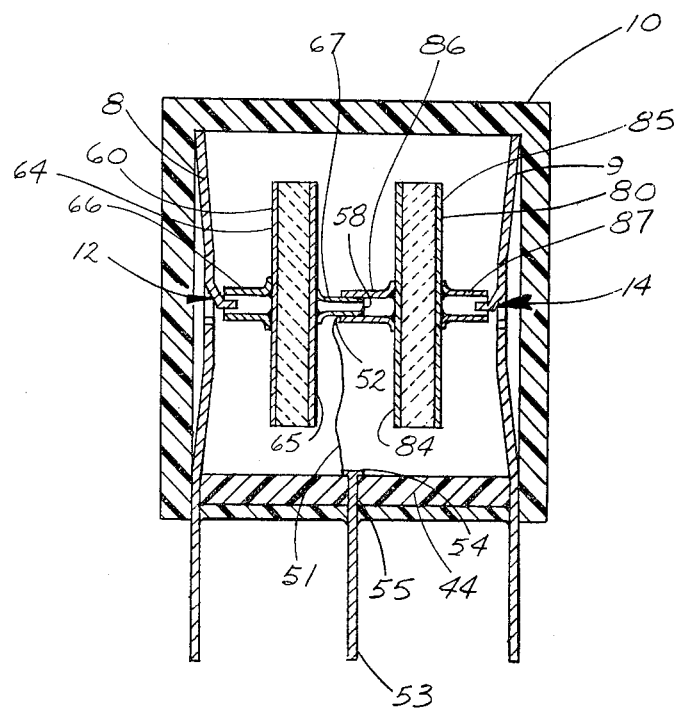
FIG. 2 is a cross sectional elevation view of a double resonator filter device embodying aspects of the present inventions.

FIGS. 1 and 2 show preferred embodiments of the single and multiple resonator constructions, respectively. In the single resonator preferred embodiment of FIG. 1, a resonator 1 having a piezoelectric ceramic body 3 with oppositely disposed outer metallic faces 4 and 5 has a pair of hollow tubular projections 6 and 7 fixedly soldered to the faces 4 and 5. Support means for the resonator is provided by a pair of springs 8 and 9 mounted in the housing 10 and having extensions 12 and 14 which engage the tubular projections 6 and 7 adjacent the open ends of the tubes to suspend the resonator 1 inside the housing 10. The extensions 12 and 14 terminate in blades 15 and 16 which exert a blade like pressure on the ends of the tubes and positioning tabs 17 and 18 which project part way inside the tubes.

The preferred resonator 1 is a round, solid piezoelectric ceramic disc. The outer faces 4 and 5 of the disc 3 comprise a conventional thin coating of a metallic material such as silver, providing a pair of smooth, opposed, electrically conductive surface areas for the resonator 1.

A pair of hollow cylindrical tubular metallic projections 6 and 7 are fixably attached as by solder as at 22 (FIG. 3) and 23 to the metallic surface areas 4 and 5 with the imaginary central axis 101 and 102 of the projections 6 and 7 passing through the imaginary center 103 of the resonator 1. The tubular projections 6 and 7 preferably have respective flanges 36 and 37 which provide a broad base for the fixed and firm attachment of the projections 6 and 7 to the surface areas 4 and 5 of the resonator. It is preferred that the projections 6 and 7 be identical, having the same diameter of flange 36 and 37 to provide a symmetrical mechanical loading of the resonator to achieve optimum balance. It is preferred that the tubes be round in cross section, although they could be other shapes.

The electrically nonconductive housing 10 for the components comprises a boxlike polymeric enclosure having a top 41, four sides (only sides 42 and 43 being shown), and a polymeric floor insert 44, which provides a support means. A pair of leaf springs 8 and 9 made of spring metal are suspended between the ceiling 41, walls 42 and 43 and floor 44 of the housing 10 with the bottom portions 51 and 52 of the springs providing the electrical leads to and from the outside of the housing. As shown in FIG. 1, the springs 8 and 9 are of a bowed construction to provide a spring action. An epoxy seal 45 closes housing 10.

In the preferred embodiment (FIGS. 3 and 8) the leaf springs 8 and 9 have extensions 12 and 14 which terminate in blades 15 and 16 which have thin edges 24 and 25 which engage the end edges 27 and 28 of the tubes 6 and 7. The blades 15 and 16 have tabs 17 and 18 which slidably project inside the tubes in a minimum engagement with the tube inner walls 31 and 32, to position the blades 15 and 16 against the tube edges. By such arrangement, the primary spring force is exerted by the blade edges 24 and 25 which exert a strong but thin force generally parallel to the axis of the tubes. The tabs 17 and 18 slightly engage the inner walls 31 and 32 of the tube, but exert minimum radially directed pressure thereon.

An example of a 455 Khz resonator made in accordance with the present invention is a lead zirconate titanate ceramic body 3 of thickness of about 0.025 inches and coated with silver of a thickness of about 0.0005 inches to provide the outer faces 4 and 5. The tubular projections 6 and 7 are made of solder plated brass, have a length of about 0.05 inches, an outer diameter of about 0.04 inches and an inner diameter of about 0.03 inches. The flanges 36 and 37 have a diameter of about 0.062 inches and a thickness of 0.005 inches. The thickness of the spring blade-like extensions 12 and 14 is 0.007 inches.

In order to have compliance, the length of the tubes should be approximately ⅛ of wave length or less so that the extension does not contribute a resonance of its own.

In the preferred form of multiple resonator embodiment of the invention shown in FIG. 2, a pair of resonators 60 and 80 are suspended in casing 10 between springs 8 and 9. The resonators 60 and 80 are connected to each other by tubular projections 67 and 86 which force fit together. The assembly is then suspended between springs 8 and 9 comparably to the previously described assembly of the single resonator device by tubular projections 66 and 87 engaged by spring extensions 12 and 14. A ground wire 51 is connected at one end, as at 52, inside the telescopic interfit of tubular projections 67 and 86 and at the other end to ground post 53 to provide a ground connection for the device.

In order to provide the force fit between telescoping tubular projections 67 and 86, the outer diameter of the inner tube 67 should be slightly larger than the inner diameter of the outer tube 86. E.G. for a 455 Khz device diameter of the inner tube 67 could be 0.032 inches, and the inner diameter of the outer tube 86 could be 0.03 inches. The inner tube should have a rounded edge so that the outer tube can ride over the outer circumference of the inner tube. In the example, the thickness of tubes 67 and 86' could be about 0.006 inches. By such telescoping arrangement, the assembly of the resonators, pretuned, can be rapidly made.

In the two resonator device of FIG. 2 both resonators are "end" resonators, as the term is used herein. The reference to "outer" and "inner" faces refers to the position of the resonators in the filter device. Thus, faces 64 and 85 are "outer" faces, and faces 65 and 84 are "inner" faces. While only two resonators are shown, additional resonators could be disposed between the "end" resonators.

By a hollow coupler, the diameter of the coupler can be larger than a solid coupler to produce the same band width, and as a result a much stronger less fragile assembly is made.

Similarly, by varying the diameters of the telescopic tubes the band width can be varied. The larger the diameters for the connecting telescopic tubes, such as tubes 86 and 67, the greater the band width. In order to have optimum balance of the filter, the tubular projections on the outer faces of the end resonators, such as projections 66 and 87 should be the same diameter as the diameter of the outer coupling connection tube 86.

A ground for the two resonator device is provided by wire 51 which is connected to ground post 53. Post 53 is disposed in opening 55 in the casing floor 44 and held in place by head 54. In assembly, wire 51 is placed inside the projection 86 prior to insertion of the projection 67 therein.

One aspect of the preferred embodiment is that the fixed attachment is by soldering the projections to the conducting surfaces of the resonator with the attachment of the springs to the projections being remote from such surfaces by a structure which minimizes the transfer of mechanical energy.

While the soldered projections, could be solid rather than hollow and achieve some of the advantages of the present invention, the control of parameters would be more difficult due to poor control of solder flow. Moreover, for the intercoupling of two resonators, at least one of the tubes would have to be hollow to achieve some of the advantages of the embodiment of FIG. 2.

Impedance transformation can be obtained by varying the capacitance of each resonator. This can be accomplished by dimensioning of the electrode diameter or resonator thickness, and the use of ceramic formulations having different dielectric constants.

In the coupling of two resonators, a slightly higher degree of mechanical coupling can be obtained by using solder plated tubes and applying heat to the coupled tubes to cause the solder, such as 21, which was used to attach the tubes to the resonator to reflow and bond the telescoping interfit. The improved physical bond causes an increase in band width.

In the multiple resonator construction spurious resonances are greatly reduced, but not eliminated completely. To still further reduce such resonances it has been found that in the multiple construction additional suppression of spurious resonances in the assembled filter can be accomplished by applying a coating to one side of the metal support member, i.e. to springs 8 and 9, including tabs 12 and 14. A suitable coating is a silicone adhesive coated tape. Such coating is applied to the side of the support member in contact with the plastic case. One method of applying the coating is to apply an adhesive coated tape to the spring prior to forming the tab. As the tab is formed, the tape is cut to conform to the shape of the tab. The physical contact made at the edges of the tubular projections 6 and 7 and the tabs 12 and 14 provides a good electrical contact and support for the filter. The adhesive tape forms a damping material which suppresses resonances attributable to the support structure. It also suppresses a spurious resonance of an extensional mode controlled by the length of the assembly, i.e. from the end of one tube to the end of the other.

In a still further embodiment, the resonators may be of different shapes. For example, as shown in FIG. 7 one resonator, such as 60, could be round, and the other one, 100, could be square. An advantage of using two geometric shapes is that additional suppression of unwanted responses, such as overtones and spurious responses is provided. The unwanted responses are usually at different frequencies for the two geometries so that one resonator will suppress the unwanted responses of the other.

I claim:

1. A piezoelectric resonator assembly including support means at least two piezoelectric resonators disposed adjacent each other and operably connected to said support means coupling means mechanically coupling said resonators together said coupling means being hollow.

2. A piezoelectric resonator assembly including
support means
at least two piezoelectric resonators disposed adjacent each other and operably connected to said support means
said resonators having confronting faces
coupling means mechanically coupling said resonators together
said coupling means including projecting means projecting from said confronting faces and telescopically interfitting.

3. A piezoelectric resonator assembly in accordance with claim 2 wherein
at least one of said projection means is hollow.

4. A piezoelectric resonator assembly in accordance with claim 2 wherein
said telescopic interfitting is a force fit.

5. A piezoelectric resonator assembly in accordance with claim 2 wherein
at least one of said projection means is hollow and soldered to one of said confronting faces with the solder being at least partly within said hollow portion and wherein
the projection means are telescopically interfit and
the projection means are then heated to cause some of the solder to reflow to bond the interfit.

6. A piezoelectric resonator assembly in accordance with claim 2 wherein:
other projection means project from the outer faces of said resonators in a manner to vibrate with the resonators and to provide a generally mechanical balance to each resonator for the mechanical load placed on the resonator by the mechanical coupling between the resonators to thereby reduce spurious resonances when the resonators are in the vibratory condition.

7. A piezoelectric resonator assembly in accordance with claims 1 or 2 wherein said resonators have at least one electrically conductive surface portion on each face, and electrical conduction means operatively connected to said conductive surfaces.

8. A piezoelectric resonator assembly in accordance with claim 7 including
a nonconductive casing having
electrically conductive leads extending therethrough
said electrical conduction means being operatively electrically connected to said leads.

9. A piezoelectric resonator assembly including
support means
at least one piezoelectric resonator operably connected to said support means
said support means including leaf spring means
said resonator having at least one face from which projection means project
blade means operably connecting said spring means to said projection means.

10. A piezoelectric resonator assembly in accordance with claim 9 wherein
said blade means contacts said projection means at a location spaced from said face.

11. A piezoelectric resonator assembly in accordance with claim 9 wherein
said projection is a tubular means and
said blade means contacts said tubular means at the end of said tubular means.

12. A piezoelectric resonator assembly in accordance with claim 11 wherein
said blade means has a tab which projects inside the end of said tubular means.

13. A piezoelectric resonator assembly in accordance with claim 9 wherein said spring means is a leaf spring.

14. A piezoelectric resonator assembly in accordance with claim 9 wherein the face of said resonator is free of contact with said blade means.

15. A piezoelectric resonator assembly including:
support means;
two piezoelectric resonators each of which has an inner face and an outer face;
mechanical coupling means mechanically coupling the inner faces of said resonators to each other in spaced relationship;
said resonators being operably connected to the support means to allow vibrational movement of the resonators at least a portion of the surface of the faces of the resonators being electrically conductive;
projection means projecting beyond the outer face of each resonator in a manner to vibrate with the resonators and to provide general mechanical balance to each resonator for the mechanical load placed on the resonators by the coupling means between the resonators, to thereby reduce spurious resonances when the resonators are in the vibratory condition;
electrical leads for connecting said resonators in an electric circuit
said electrically conductive portion of the surface of the faces being operably electrically connected to said leads.

16. A piezoelectric resonator assembly in accordance with claim 15 wherein said projection means are hollow tubes.

17. A piezoelectric resonator assembly in accordance with claim 15 wherein;
the operable connection between the resonators and the support means includes spring means which contacts said support means and said projection means.

18. A piezoelectric resonator assembly in accordance with claim 17 wherein;
said spring means contacts said projection means at a location spaced from said surface area and is interlocked on said projection means against movement parallel to the general plane of the resonator.

19. A piezoelectric resonator assembly in accordance with claim 15 wherein;
the outer cross section span of the projection means are substantially the same as the outer diameter of the mechanical coupling.

20. A piezoelectric resonator assembly in accordance with claim 15 wherein;
said projection means and said mechanical coupling means are concentric with the imaginary center of said resonators.

21. A piezoelectric resonator assembly in accordance with claim 15 wherein;
at least one resonator is mechanically coupled in spaced relationship between said first mentioned resonators.

22. A piezoelectric resonator assembly in accordance with claim 15 wherein
the mechanical coupling means includes at least one resonator mechanically coupled between the inner faces of said first mentioned resonators.

23. A piezoelectric resonator assembly in accordance with claim 15 including:
said assembly being enclosed by electrically nonconductive enclosure, with said electrical leads projecting through said enclosure.

24. A piezoelectric resonator assembly in accordance with claim 23 wherein:
said mechanical coupling means is electrically conductive so as to provide at least a part of said electrical connection between the resonators; and
said projection means are electrically conductive so as to provide at least a part of the electric connection to said leads.

25. A piezoelectric resonator assembly including:
a support means;
at least one solid piezoelectric resonator operably connected to said support means;
said resonator having an electrically conductive area on each face;
electrically conductive projection means projecting from said electrically conductive areas;
electrically conductive spring means interlocked to said projection means at a location spaced from said surface area to prevent movement of the resonator in a direction parallel to the general plane of the resonator;
said projection means are mounted so as to vibrate with the resonator.

26. A piezoelectric resonator assembly in accordance with claim 25 wherein
the interlocking of said spring means includes a tab means
said projection means being hollow and
said tab means extending inside said projection means.

27. A piezoelectric resonator assembly in accordance with claim 25 including said projection means being hollow.

28. A piezoelectric resonator assembly in accordance with claim 25 wherein;
said projection means project from the imaginary geometric center of the resonator.

29. A piezoelectric resonator assembly in accordance with claim 25 wherein said spring means is a leaf spring.

30. A piezoelectric resonator assembly in accordance with claim 25 wherein the electrically conductive area of said resonator is free of contact with said spring means.

31. A piezoelectric resonator assembly in accordance with claim 25 including:
an electrically non-conductive housing enclosing the assembly
electrical leads projecting through said housing
said electrically conductive spring means being operably electrically connected to said electrical leads.

32. A piezoelectric resonator assembly in accordance with claim 15 or 31 where the confronting faces of said resonators are operably connected to each other.

33. A piezoelectric resonator assembly including:
support means;
at least two piezoelectric resonators mechanically coupled in spaced relationship in an assembly;
said assembly bring operably connected to said support means;
said resonators having peripheries of different geometric shapes.

34. A piezoelectric resonator assembly in accordance with claim 33 wherein
the periphery of one of said resonators is of a curvilinear periphery and the other of said resonators is of a planar periphery.

35. A piezoelectric resonator assembly in accordance with claim 33 wherein
the periphery of one of said resonators defines a circle and;
the periphery of the other of said resonators defines a square.

36. A piezoelectric resonator assembly in accordance with claim 33 including:
a casing,
electrically conductive leads projecting exteriorly of said casing,
means electrically connecting said resonators to each other,
means electrically connecting the outermost of said resonators to said leads.

37. A piezoelectric resonator including a piezoelectric resonator having oppositely disposed faces, each of said faces having an electrically conductive surface area hollow projection means projecting from each surface area the outer cross sectional span of one of said projection means being less than the inner cross-sectional span of the other.

* * * * *